United States Patent
Wan et al.

(10) Patent No.: US 10,462,938 B2
(45) Date of Patent: Oct. 29, 2019

(54) INVERTER POWER CABINET

(71) Applicant: SUNGROW POWER SUPPLY CO., LTD., Hefei Anhui (CN)

(72) Inventors: Rubin Wan, Hefei Anhui (CN); Xiaohu Wang, Hefei Anhui (CN); Jun Tan, Hefei Anhui (CN); Qiyao Zhu, Hefei Anhui (CN); Hao Zheng, Hefei Anhui (CN)

(73) Assignee: SUNGROW POWER SUPPLY CO., LTD., Hefei Anhui (CN)

( * ) Notice: Subject to any disclaimer, the term of this patent is extended or adjusted under 35 U.S.C. 154(b) by 0 days.

(21) Appl. No.: 15/987,333

(22) Filed: May 23, 2018

(65) Prior Publication Data
US 2018/0352685 A1  Dec. 6, 2018

(30) Foreign Application Priority Data
Jun. 5, 2017 (CN) .......................... 2017 1 0413149

(51) Int. Cl.
*H05K 7/20* (2006.01)
*H02M 7/00* (2006.01)

(52) U.S. Cl.
CPC ........ *H05K 7/20909* (2013.01); *H02M 7/003* (2013.01); *H05K 7/206* (2013.01);
(Continued)

(58) Field of Classification Search
CPC ........... H05K 7/20909; H05K 7/20172; H05K 7/20181; H05K 7/20572; H05K 7/209;
(Continued)

(56) References Cited

U.S. PATENT DOCUMENTS

| | | | | |
|---|---|---|---|---|
| 1,821,898 A | * | 9/1931 | Rypinski | H02B 1/56 361/646 |
| 6,119,768 A | * | 9/2000 | Dreier | H05K 7/206 165/103 |

(Continued)

FOREIGN PATENT DOCUMENTS

| CN | 203352422 U | 12/2013 |
|---|---|---|
| CN | 203387391 U | 1/2014 |

(Continued)

OTHER PUBLICATIONS

SIPO First Office Action corresponding to CN Application No. 201710413149.6; dated Sep. 29, 2018.

*Primary Examiner* — Mandeep S Buttar
(74) *Attorney, Agent, or Firm* — Cantor Colburn LLP (57) ABSTRACT

An inverter power cabinet includes a cabinet body and power devices arranged in the cabinet body. The cabinet body includes a low-protection grade installation cavity and an airtight high-protection grade installation cavity hermetically isolated from each other; the power devices include high protection grade power devices arranged in the low-protection grade installation cavity and low-protection grade power devices arranged in the high-protection grade installation cavity; the low-protection grade installation cavity has an outer cold air inlet and an inner hot air outlet in communication with outside world, and a first fan is provided in the low-protection grade installation cavity; and the inverter power cabinet includes a heat exchanger configured to dissipate heat of the high-protection grade installation cavity. The inverter power cabinet can avoid direct contact of the low-protection grade power devices with a harsh environment, thereby preventing the contaminated cold air from damaging the low-protection grade power devices.

8 Claims, 6 Drawing Sheets

(52) U.S. Cl.
CPC ..... *H05K 7/20154* (2013.01); *H05K 7/20172* (2013.01); *H05K 7/20181* (2013.01); *H05K 7/20572* (2013.01)

(58) Field of Classification Search
CPC ............... H05K 7/20918; H02M 7/003; H01L 2924/0002; H01L 23/34; H01L 25/18
USPC .......................................................... 361/695
See application file for complete search history.

(56) References Cited

U.S. PATENT DOCUMENTS

| | | | | |
|---|---|---|---|---|
| 6,164,369 | A * | 12/2000 | Stoller | H05K 7/20572 165/104.33 |
| 6,598,668 | B1 * | 7/2003 | Cosley | H05K 7/206 165/104.32 |
| 2011/0058330 | A1 * | 3/2011 | Abraham | G06F 1/20 361/679.47 |
| 2012/0014063 | A1 * | 1/2012 | Weiss | H05K 7/20163 361/697 |
| 2016/0021768 | A1 * | 1/2016 | Webster | H05K 7/206 165/80.2 |

FOREIGN PATENT DOCUMENTS

| | | |
|---|---|---|
| CN | 203574996 U | 4/2014 |
| CN | 204721201 U | 10/2015 |
| CN | 105682430 A | 6/2016 |

* cited by examiner

INVERTER POWER CABINET

The present application claims priority under 35 U.S.C. § 119 to Chinese Patent Application No. 201710413149.6, filed on Jun. 5, 2017, the entire content of which are incorporated herein by reference.

FIELD

The present application relates to the technical field of electrical equipment, and more specifically to an inverter power cabinet.

BACKGROUND

As an interface device between a solar power generation system and a power grid, a photovoltaic grid-connected inverter has a heat dissipation performance which significantly affects the working stability of the entire inverter system, the service life of the power device and the volume of the product. Internal components of the inverter include high-protection grade power devices such as a reactor, a resistor and a heat sink, and low-protection grade power devices such as an inverting module, a capacitor, a DC (direct current) air switch component, an AC (alternate current) capacitor, an AC breaker and an AC contactor.

Considering the power loss characteristics and economy of the high-power grid-connected inverters, most of the high-power grid-connected inverters adopt forced air cooling to dissipate heat, that is, all the devices inside the inverter are placed in cold air.

The cooling medium for the above forced air cooling is outside air with room temperature, and when the inverter is in a harsh environment, outside cold air blows into the inverter, the contaminated cold air therein is apt to damage the devices inside the inverter, particularly some low-protection grade devices such as the circuit board, resulting in a decreased overall protection grade of the inverter and affecting the service life of the inverter.

In summary, a technical issue to be addressed urgently by those skilled in the art is to improve the overall protection grade of the inverter.

SUMMARY

In view of this, an object of the present application is to provide an inverter power cabinet to improve the overall protection grade of the inverter.

In order to achieve the above object, the following technical solutions are provided according to the present application.

An inverter power cabinet, includes a cabinet body and power devices arranged in the cabinet. The cabinet body has a low-protection grade installation cavity and a high-protection grade installation cavity, the high-protection grade installation cavity is an airtight cavity;
  the power devices include high protection grade power devices arranged in the low-protection grade installation cavity and low-protection grade power devices arranged in the high-protection grade installation cavity;
  the low-protection grade installation cavity has an outer cold air inlet and an inner hot air outlet which are in communication with outside world, and a first fan is further provided in the low-protection grade installation cavity; and
  the inverter power cabinet further includes a heat exchanger configured to dissipate heat of the high-protection grade installation cavity.

Preferably, in the above inverter power cabinet, at least one second fan is further arranged in the high-protection grade installation cavity.

Preferably, the above inverter power cabinet includes a DC cabinet and an AC cabinet, specifically,
  the DC cabinet has the low-protection grade installation cavity and a first high-protection grade installation cavity, and the low-protection grade installation cavity is hermetically separated from the first high-protection grade installation cavity;
  the AC cabinet has a second high-protection grade installation cavity; and
  the high-protection grade installation cavity includes the first high-protection grade installation cavity and the second high-protection grade installation cavity.

Preferably, in the above inverter power cabinet, the first high-protection grade installation cavity and the second high-protection grade installation cavity are separated from each other by a partition plate, and the partition plate is provided with an inner circulation air outlet and an inner circulation air inlet via which the first high-protection grade installation cavity is in communication with the second high-protection grade installation cavity; and
  the number of the heat exchanger is one, and the one heat exchanger is arranged on an AC cabinet door plate of the AC cabinet, and a heat dissipation passage of the heat exchanger is in communication with the second high-protection grade installation cavity.

Preferably, in the above inverter power cabinet, the first fan is an centrifugal fan; and
  the number of the at least one second fan is two, and the two second fans are respectively an inner circulation axial flow fan arranged in the first high-protection grade installation cavity and an inner circulation centrifugal fan arranged in the second high-protection grade installation cavity.

Preferably, in the above inverter power cabinet, the inner circulation centrifugal fan is arranged on the AC cabinet door plate, and the AC cabinet door plate is further provided with an inner circulation air duct via which an air outlet of the inner circulation centrifugal fan is in communication with an air inlet of the heat dissipation passage.

Preferably, in the above inverter power cabinet, the heat exchanger is an aluminum foil air-air heat exchanger; and
  the AC cabinet door plate is further provided with an outer circulation air duct configured to introduce cold air to fins of the aluminum foil air-air heat exchanger, and the outer circulation air duct has an outer circulation air inlet and an outer circulation air outlet which are in communication with the outside world, and an outer circulation centrifugal fan is arranged in the outer circulation air duct.

Preferably, in the above inverter power cabinet, the high-protection grade power devices include a reactor, a resistor, and a heat sink; and
  the low-protection grade power devices include:
    an inverter module, a capacitor and a DC air switch component arranged in the first high-protection grade installation cavity; and
    an AC capacitor, an AC breaker and an AC contactor arranged in the second high-protection grade installation cavity.

Preferably, in the above inverter power cabinet, the number of the DC cabinet is two and the two DC cabinets are respectively located at two sides of the AC cabinet.

Preferably, in the inverter power cabinet, the outer cold air inlet is located at a bottom of a side wall of the low-protection grade installation cavity, and the inner hot air outlet is located at a top wall of the low-protection grade installation cavity;

an air-in louvered component is provided at the outer cold air inlet; and a top air-out component is provided at the inner hot air outlet, and includes an air-out louvered component and a labyrinthine passage arranged inside the air-out louvered component.

It can be seen from the above technical solutions that the inverter power cabinet according to the present application includes a cabinet body and power devices arranged in the cabinet body. The cabinet body has a low-protection grade installation cavity and a high-protection grade installation cavity, and the high-protection grade installation cavity is an airtight cavity. The power devices include high-protection grade power devices arranged in the low-protection grade installation cavity and low-protection grade power devices arranged in the high-protection grade installation cavity. The low-protection grade installation cavity has an outer cold air inlet and an inner hot air outlet which are in communication with the outside world, and a first fan is further provided in the low-protection grade installation cavity. The inverter power cabinet further includes a heat exchanger configured to dissipate heat of the high-protection grade installation cavity.

The inverter power cabinet according to the present application has a cold air duct for forced air cooling formed in the low-protection grade installation cavity by the cooperation of the outer cold air inlet and the inner hot air outlet and the first fan, and utilizes the outside cold air entering the low-protection grade installation cavity to dissipate heat of the high-protection grade power devices within the low-protection grade installation cavity; and to dissipate heat of the low-protection grade power devices in the high-protection grade installation cavity by a heat exchanger hermetically, that is, the high-protection grade installation cavity is not in communication with the outside world, to achieve the heat exchange by flowing of inside air, to avoid direct contact of the low-protection grade power devices with a harsh environment, thereby preventing the contaminated cold air from damaging the low-protection grade power devices, thus the high-protection grade installation cavity can effectively protect the low-protection grade power devices therein, to further improve the overall protection grade of the inverter and extend the service life of the inverter.

Moreover, the above inverter power cabinet adopts a heat dissipation way in which the forced air cooling type heat dissipation is combined with the airtight type heat dissipation, and the forced air cooling type heat dissipation can meet the heat dissipation requirements of the high-protection grade power devices having a large power, and the airtight heat dissipation can meet the heat dissipation requirements of low-protection grade power devices having a small power, thereby improving the overall heat dissipation efficiency of the inverter.

BRIEF DESCRIPTION OF THE DRAWINGS

For more clearly illustrating the technical solutions in embodiments of the present application or in the conventional technology, drawings referred to describe the embodiments or the conventional technology will be briefly described hereinafter. Apparently, the drawings in the following description are only some examples of the present application, and for those skilled in the art, other drawings may be obtained based on these drawings without any creative efforts.

Reference Numerals in FIG. 1 to FIG. 6:

| | |
|---|---|
| 1 right DC cabinet, | 1-1 air-in louvered component, |
| 1-2 reactor, | 1-3 resistor, |
| 1-4 first fan, | 1-5 heat sink, |
| 1-6 inverting module, | |
| 1-7 partition plate (a generic term of mounting plates for devices in DC cabinets and separating plates in the DC cabinets for separating the DC cabinets from the AC cabinet 2), | |
| 1-7-1 inner circulation air inlet, | 1-7-2 inner circulation air outlet, |
| 1-8 capacitor, | 1-9 inner circulation axial flow fan, |
| 1-10 DC air switch component; | |
| 2 AC cabinet, | 2-1 AC cabinet door plate, |
| 2-2 AC capacitor, | 2-3 AC breaker, |
| 2-4 AC contactor, | 2-1-1 inner circulation centrifugal fan, |
| 2-1-2 inner circulation air duct, | 2-1-3 heat exchanger, |
| 2-1-4 heat dissipation passage air outlet, | 2-1-5 outer circulation centrifugal fan, |
| 2-1-6 outer circulation air inlet, | 2-1-7 outer circulation air outlet; |
| 3 left DC cabinet; | |
| 4 top air-out component, | 4-1 air-out louvered component, |
| 4-2 labyrinthine passage; | |
| I direction of airflow in forced cold air duct (hollow arrows); | |
| II direction of inner circulation airflow of high-protection grade installation cavity (solid arrows); | |
| III direction of outer circulation airflow of heat exchanger (hollow arrows); | |
| A-A cross-section of the right DC cabinet, | |
| B-B cross-section of the AC cabinet. | |

DETAILED DESCRIPTION

An inverter power cabinet is provided according to an embodiment of the present application, which improves the overall protection grade of the inverter.

In order to make the objectives, technical solutions and advantages of the embodiments of the present application more comprehensible, the technical solutions in the embodiments of the present application will be described clearly and completely hereinafter in conjunction with the drawings in the embodiments of the present application. Apparently, the described embodiments are only a part of embodiments of the present application, rather than all embodiments. Based on the embodiments in the present application, all of other embodiments, made by those skilled in the art without any creative efforts, fall into the scope of the present application.

Referring to FIG. 1 to FIG. 6, an inverter power cabinet according to an embodiment of the present application includes a cabinet body and power devices arranged in the cabinet body. The cabinet body has a low-protection grade installation cavity and a high-protection grade installation cavity, and the high-protection grade installation cavity is an airtight cavity. The power devices include high-protection grade power devices arranged in the low-protection grade installation cavity and low-protection grade power devices arranged in the high-protection grade installation cavity. The low-protection grade installation cavity has an outer cold air inlet and an inner hot air outlet which are in communication with the outside world, and a first fan 1-4 is further provided in the low-protection grade installation cavity. The inverter power cabinet further includes a heat exchanger 2-1-3 configured to dissipate heat of the high-protection grade installation cavity.

Figure 2:
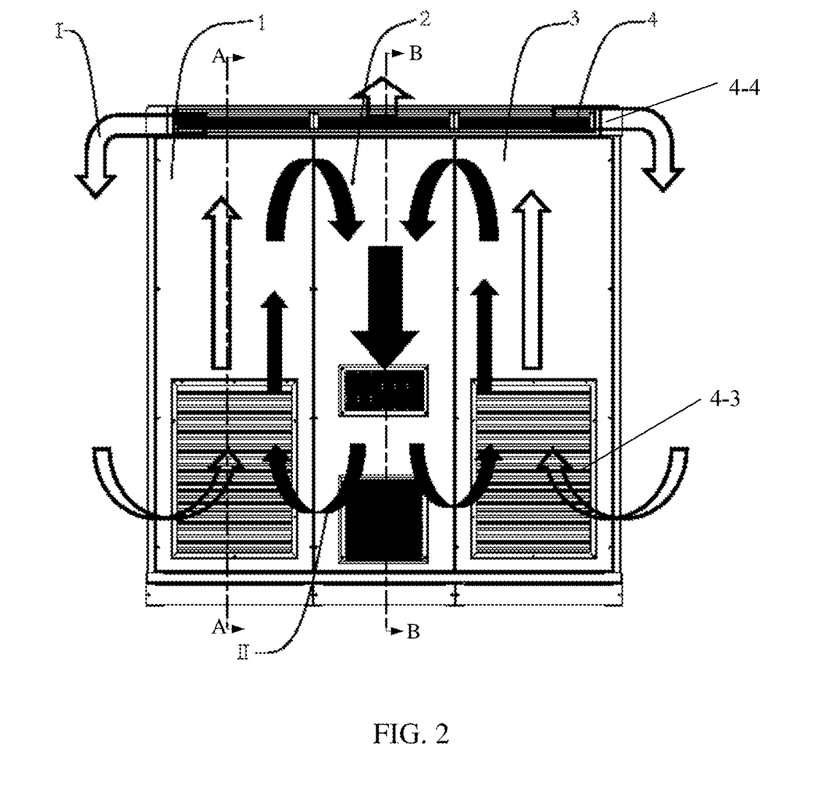
FIG. 2 is a front view of an inverter power cabinet according to an embodiment of the present application.
Figure 3:
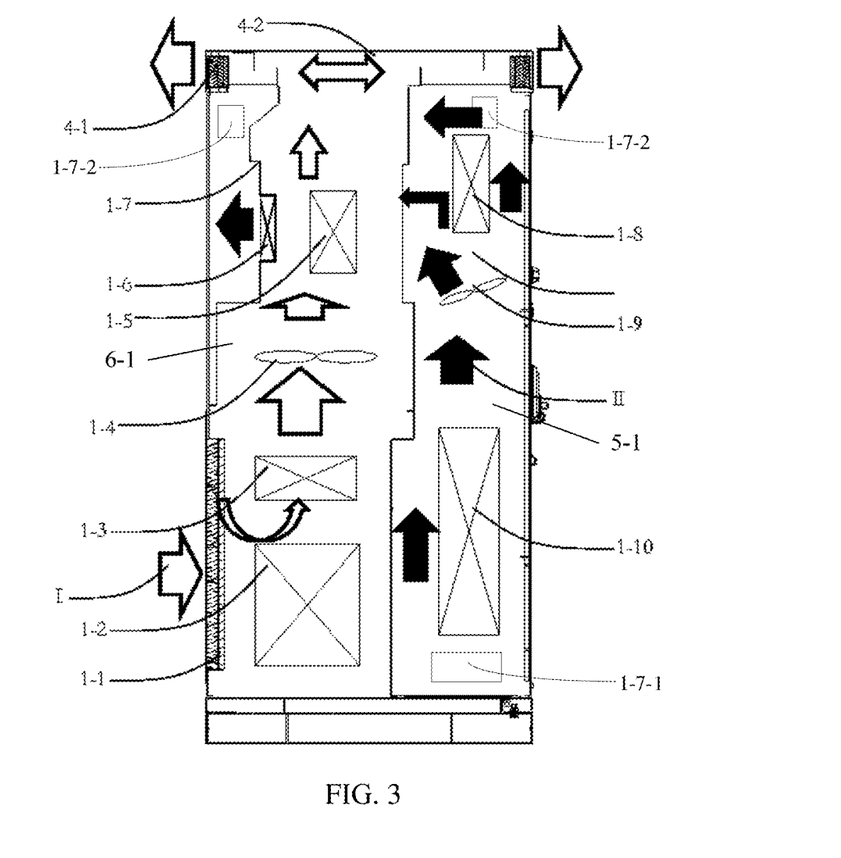
FIG. 3 is a cross-sectional view taken along line A-A in FIG. 2.

By the cooperation of the outer cold air inlet, the inner hot air outlet and the first fan 1-4 of the inverter power cabinet according to the present application, a cold air duct for forced air cooling is formed in the low-protection grade installation cavity, and heat of the high-protection grade power devices in the low-protection grade installation cavity is dissipated by utilizing the outside cold air entering the low-protection grade installation cavity, with the direction of the hollow arrows indicated by I in FIG. 2 to FIG. 3 being just the direction of the airflow in the cold air duct for forced air cooling. The cold air in the environment getting through the outer cold air inlet and being forced by the first fan 1-4 of the inverter cabinet, exchanges heat with the high IP grade power devices in the low-protection grade installation room, and outflows to the environment by the inner hot air outlet. And heat of the low-protection grade power devices in the high-protection grade installation cavity is dissipated in an airtight manner by a heat exchanger 2-1-3, that is, the high-protection grade installation cavity is not in communication with the outside world, the heat is exchanged by flowing of the inner air, thus avoiding direct contact of the low-protection grade power devices with a harsh environment, thereby preventing the contaminated cold air from damaging the low-protection grade power devices. The high-protection grade installation cavity can effectively protect the low-protection grade power devices therein, which further improves the overall protection grade of the inverter and extends the service life of the inverter.

Moreover, the above inverter power cabinet adopts a heat dissipation manner in which the forced air cooling type heat dissipation is combined with the airtight type heat dissipation, and the forced air cooling type heat dissipation can meet the heat dissipation requirements of the high-protection grade power devices having a large power, and the airtight type heat dissipation can meet the heat dissipation requirements of the low-protection grade power devices having a small power, thereby improving the overall heat dissipation efficiency of the inverter.

In order to improve the heat dissipation efficiency of the high-protection grade installation cavity, a second fan is further provided in the high-protection grade installation cavity. The present application utilizes the second fan to facilitate the flowing of air in the high-protection grade installation cavity to form an inner circulation air duct in the high-protection grade installation cavity, thus increasing the speed of the heat exchange between the heat exchanger 2-1-3 and the air in the high-protection grade installation cavity.

It can be understood that, the above second fan may not be provided according to the present application, and only a temperature difference of the air in the high-protection grade installation cavity is utilized to drive the air to flow. Alternatively, the same effect of improving the heat dissipation efficiency of the high-protection grade installation cavity may be achieved by providing more heat exchangers 2-1-3, which is not described herein.

In an embodiment of the present application, the cabinet includes a DC cabinet and an AC cabinet 2, the DC cabinet has a low-protection grade installation cavity and a first high-protection grade installation cavity, and the low-protection grade installation cavity is hermetically separated from the first high-protection grade installation cavity by a partition plate.

The AC cabinet 2 has a second high-protection grade installation cavity. The high-protection grade installation cavity includes the first high-protection grade installation cavity and the second high-protection grade installation cavity.

In the present application, the DC power devices are arranged in the DC cabinet, and the AC power devices are arranged in the AC cabinet 2, thus the arrangement is neat and the cable arranging and assembling of the power devices is facilitated. Since some of the DC power devices belong to the high-protection grade power devices, and some belong to the low-protection grade power devices, the DC cabinet is partitioned into the low-protection grade installation cavity and the first high-protection grade installation cavity which are partitioned hermetically. Alternatively, the above cabinet can also be arranged in other manners, for example, including a high-protection grade cabinet having a low-protection grade installation cavity and a low-protection grade cabinet having a high-protection grade installation cavity.

Preferably, in the above inverter power cabinet, the first high-protection grade installation cavity and the second high-protection grade installation cavity are separated from each other by a partition plate 1-7, and the partition plate 1-7 is provided with an inner circulation air inlet 1-7-1 and an inner circulation air outlet 1-7-2 via which the first high-protection grade installation cavity is in communication with the second high-protection grade installation cavity. One heat exchanger 2-1-3 is provided and is arranged on an AC cabinet door plate 2-1 of the AC cabinet 2, and a heat dissipation passage of the heat exchanger 2-1-3 is in communication with the second high-protection grade installation cavity.

The above partition plate 1-7 is located between the DC cabinet and the AC cabinet 2 and separates a cavity of the DC cabinet from a cavity of the AC cabinet 2, which facilitates the arrangement of the power devices. The first high-protection grade installation cavity is in communication with the second high-protection grade installation cavity via the inner circulation air inlet 1-7-1 and the inner circulation air outlet 1-7-2, to achieve heat exchange between the insides of the two cavities. In this way, only one heat exchanger 2-1-3 is required to be used to dissipate heat of the second high-protection grade installation cavity, and then the heat exchange between the first high-protection grade installation cavity and the second high-protection grade installation cavity is utilized to achieve heat dissipation of the high-protection grade installation cavity, such that the internal structure of the inverter is compact, and the overall dimension of the inverter is small, thus effectively controlling the cost.

It can be understood that, the number of the heat exchangers 2-1-3 may also be two, and the two heat exchangers are respectively arranged on the DC cabinet and the AC cabinet 2 to respectively dissipate heat of the first high-protection grade installation cavity and the second high-protection grade installation cavity. In the present application, the above partition plate 1-7 may not be provided, such that the first high-protection grade installation cavity and the second high-protection grade installation cavity form an integral installation cavity.

In this embodiment, the air in the second high-protection grade installation cavity enters a heat dissipation passage of the heat exchanger 2-1-3 and exchanges heat with the heat exchanger 2-1-3 in the process of heat exchange, thus increasing the heat exchange area. Of course, in the present application, the second high-protection grade installation cavity may also not communicate with the heat dissipation passage of the heat exchanger 2-1-3, and a side wall of the cavity is utilized to contact with the heat dissipating structure of a heat sink 1-5 such as heat dissipation fins and the like, to achieve the same cooling effect.

Preferably, the first fan 1-4 is a centrifugal fan. According to the present application, the centrifugal fan is utilized and a forced air cooling type heat dissipation is adopted, to dissipate the heat generated by the high-heat-generating power devices, and the centrifugal fan has a good ventilation effect, and can ensure a better heat dissipation effect. Of course, the above first fan 1-4 can also be fans of other types, such as an axial flow fan, a mixed flow fan and a cross flow fan.

Figure 4:
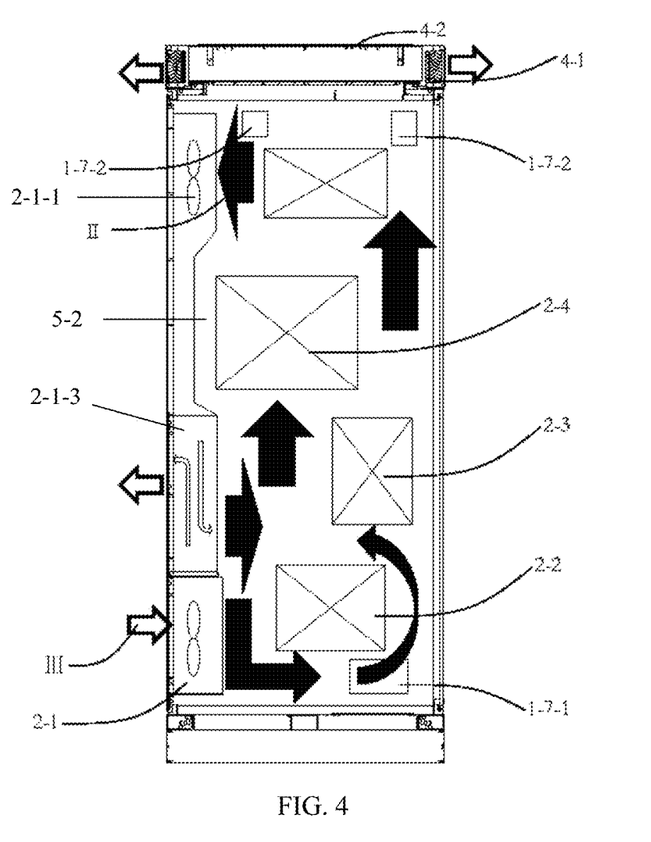
FIG. 4 is a cross-sectional view taken along line B-B in FIG. 2.

The number of the second fans is two, and the two fans are respectively an inner circulation axial flow fan 1-9 arranged in the first high-protection grade installation cavity and an inner circulation centrifugal fan 2-1-1 arranged in the second high-protection grade installation cavity. The inner circulation axial flow fan 1-9 drives the air in the first high-protection grade installation cavity to flow in a direction II, to cool and dissipate heat of the low-protection grade power devices therein. And the air in the first high-protection grade installation cavity and the air in the second high-protection grade installation cavity are driven to achieve an inner circulation flow by the inner circulation air inlet 1-7-1 and the inner circulation air outlet 1-7-2 in the partition plate 1-7, and the direction of the solid arrow as indicated by II of FIG. 2 to FIG. 4 is just the inner circulation airflow direction. Meanwhile, the inner circulation centrifugal fan 2-1-1 is utilized to allow the air in the second high-protection grade installation cavity to enter the heat dissipation passage of the heat exchanger 2-1-3, to achieve cooling of the air inside the airtight high-protection grade installation cavity. Of course, according to the present application, it is possible that only one of the inner circulation axial flow fan 1-9 and the inner circulation centrifugal fan 2-1-1 is provided, to achieve the same effect of facilitating the flowing of the inside air. The above inner circulation axial flow fan 1-9 and the inner circulation centrifugal fan 2-1-1 may also be fans of other types, which are not limited in the present application.

In a further technical solution, the inner circulation centrifugal fan 2-1-1 is arranged on the AC cabinet door plate 2-1, and the AC cabinet door plate 2-1 is further provided with an inner circulation air duct 2-1-2 via which an air outlet of the inner circulation centrifugal fan 2-1-1 is in communication with an air inlet of the heat dissipation passage. As indicated by the solid arrows shown in FIG. 5, in the process of heat dissipation, the inner circulation centrifugal fan 2-1-1 blows the hot air in the airtight high-protection grade installation cavity into the heat exchanger 2-1-3 via the inner circulation air duct 2-1-2, and the hot air exchanges heat with the heat exchanger 2-1-3 and then flows back to the high-protection grade installation cavity via a heat dissipation passage air outlet 2-1-4, thereby cooling the inside of the high-protection grade installation cavity.

Figure 5:
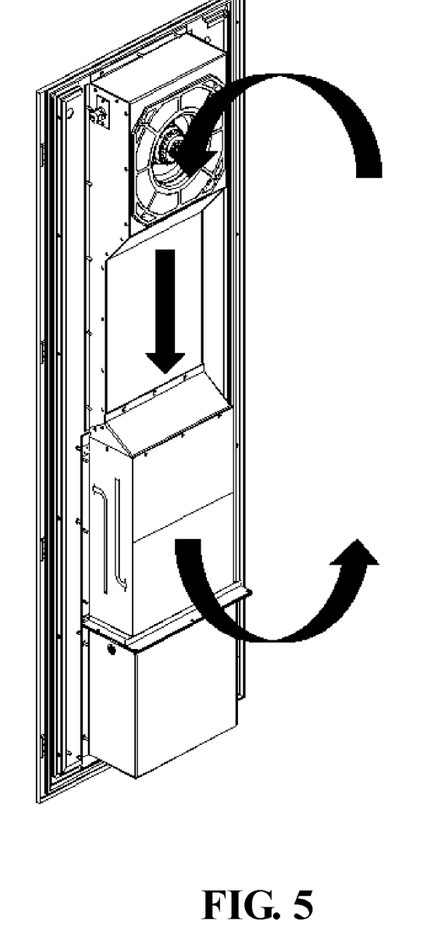
FIG. 5 is a schematic view showing the structure inside an AC cabinet door plate according to an embodiment of the present application.
Figure 6:
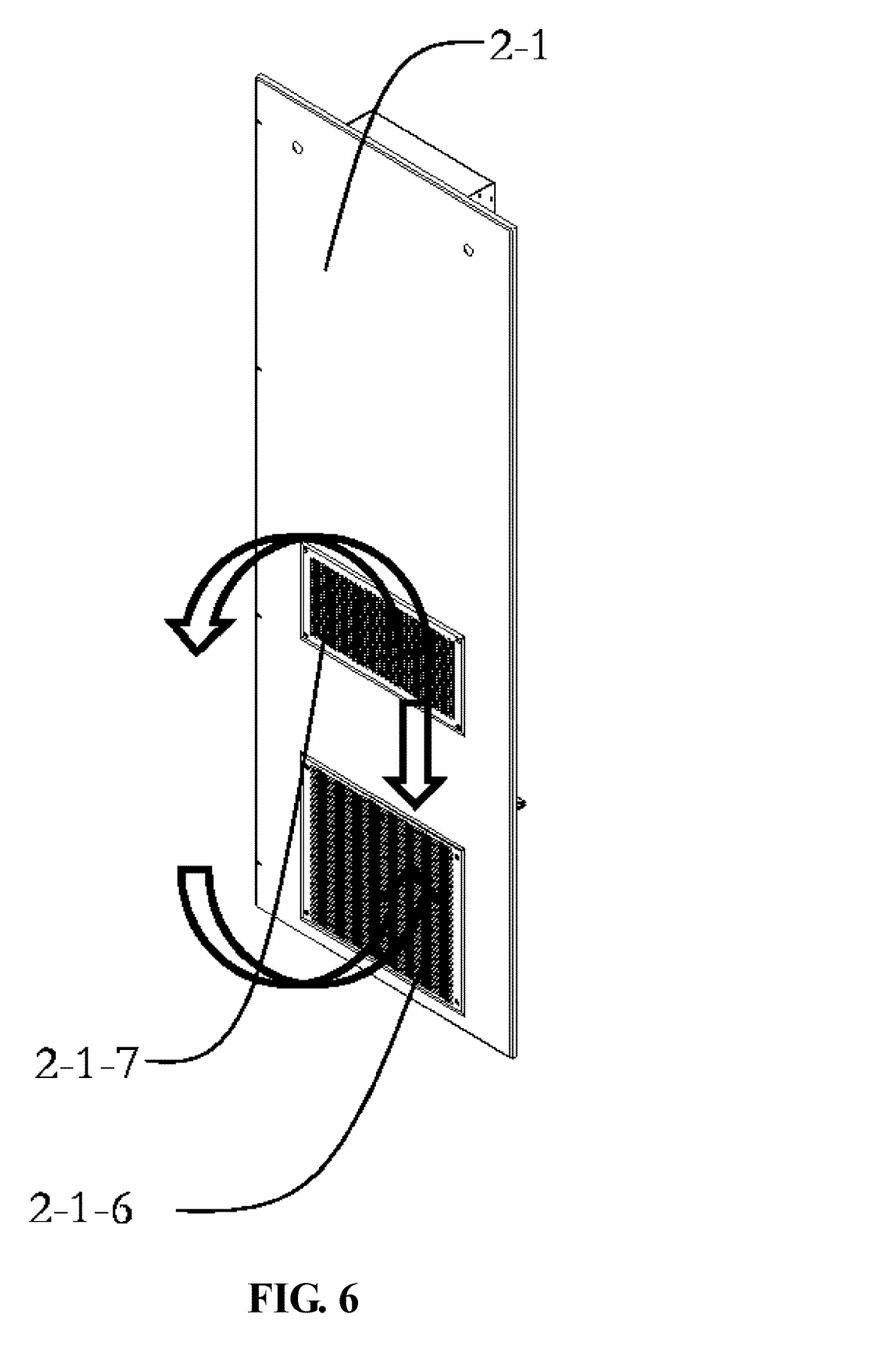
FIG. 6 is a schematic view showing the structure outside the AC cabinet door plate according to an embodiment of the present application.

The inner circulation air duct 2-1-2 can guide the air to flow, to improve the heat exchange efficiency. Of course, in the present application, the above inner circulation air duct 2-1-2 may not be provided, and the air outlet of the inner circulation centrifugal fan 2-1-1 may be directed at the heat dissipation passage of the heat exchanger 2-1-3.

Preferably, the heat exchanger 2-1-3 is an aluminum foil air-air heat exchanger. The temperature difference between the inside and the outside of the cabinet can be maintained within 10° C. by the aluminum foil air-air heat exchanger, which can effectively improve the heat dissipation inside the cabinet. Moreover, the above aluminum foil air-air heat exchanger is a complete plate-fin heat exchanger, which utilizes the outside cold air as a cooling medium to directly blow cold air to the fins, thus having a low cost and a high efficiency. Alternatively, the above heat exchanger 2-1-3 may also be a heat pipe heat exchanger or the like.

In this embodiment, the AC cabinet door plate 2-1 is further provided with an outer circulation air duct configured to introduce cold air to the fins of the aluminum foil air-air heat exchanger, and the outer circulation air duct has an outer circulation air inlet 2-1-6 and an outer circulation air outlet 2-1-7 which are in communication with the outside, and the outer circulation air duct is provided with an outer circulation centrifugal fan 2-1-5.

The outer circulation centrifugal fan 2-1-5 draws the outside cold air in through the outer circulation air duct and blows the air to the fins of the aluminum foil air-air heat exchanger to dissipate heat of the fins, thus exchanging heat of the hot air (with an airflow direction indicated by II) inside the inverter, thereby achieving the object of increasing the heat dissipation efficiency inside the cabinet. The direction of the hollow arrows indicated by III in FIG. 4 is just the outer circulation airflow direction of the heat exchanger 2-1-3. In the present application, the above outer circulation air duct may also not be provided, and the air outlet of the outer circulation centrifugal fan 2-1-5 is directed at the fins.

In an embodiment of the present application, the high-protection grade power devices include a reactor 1-2, a resistor 1-3 and the heat sink 1-5. The low-protection grade power devices include an inverting module 1-6, a capacitor 1-8 and a DC air switch component 1-10 arranged in the first high-protection grade installation cavity, and an AC capacitor 2-2, an AC breaker 2-3 and an AC contactor 2-4 arranged in the second high-protection grade installation cavity.

As shown in FIG. 3, the DC cabinet has the outside cold air (in an airflow direction I) drawn by the first fan 1-4 from an air-in louvered component 1-1 into the cabinet, to cool the reactor 1-2, the resistor 1-3 and the heat sink 1-5 and other devices, and discharge the air to the outside via the inner hot air outlet. The inner circulation axial flow fan 1-9 drives the air in the cabinet to flow in the airflow direction II, to thereby cooling and dissipating heat of the inverting module 1-6, the capacitor 1-8 and the DC air switch component 1-10 and the like. Thus, the high-protection grade devices such as the heat sink 1-5, the reactor 1-2 and the resistor 1-3 of the inverting power unit are cooled by the forced air cooling, that is, the heat of the above devices is dissipated by the first fan 1-4 in the air duct in the airflow direction I. The heat of other low-protection grade devices in the inverter is exchanged with the heat of the outside air by the aluminum foil air-air heat exchanger, to achieve the cooling effect.

Of course, according to the inverters with different structures, the above high-protection grade power devices and the low-protection grade power devices may also include other devices.

Figure 1:
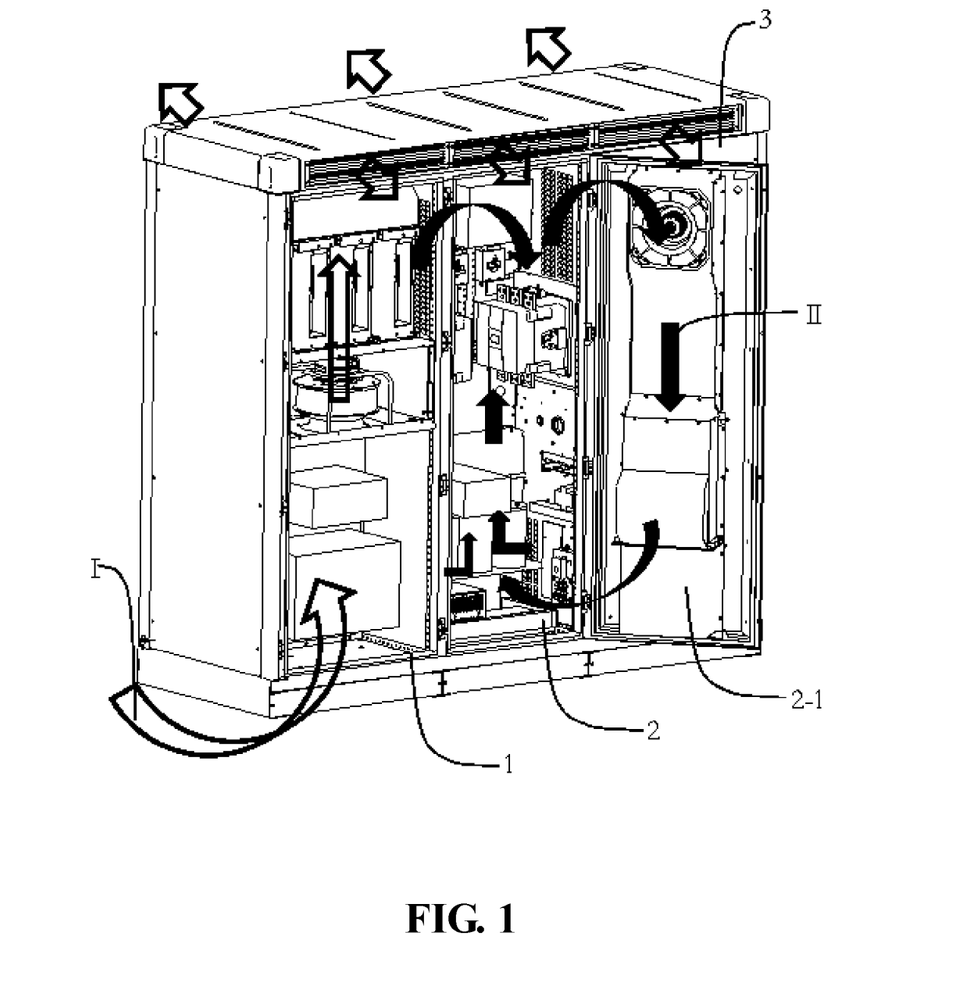
FIG. 1 is a schematic view showing a three-dimensional structure of an inverter power cabinet according to an embodiment of the present application.

Two DC cabinets are provided and are located on two sides of the AC cabinet 2 respectively. A cabinet has three sub-cabinets, of which two side cabinets are DC cabinets, and a middle cabinet is an AC cabinet 2. As shown in FIG. 1 and FIG. 2, the sub-cabinets are respectively the right DC cabinet 1, the AC cabinet 2 and the left DC cabinet 3. Two groups of DC power devices are respectively arranged in the right DC cabinet 1 and the left DC cabinet 3, and the structures and devices of the two cabinets are distributed identically.

According to the practical application requirements, the number of the above DC cabinet may also be other numbers, such as one, and the number of the AC cabinet 2 may also be other numbers, such as two.

In order to further optimize the above technical solutions, the outer cold air inlet is located at the bottom of the side wall of the low-protection grade installation cavity, and the inner hot air outlet is located at a top wall of the low-protection grade installation cavity. The air-in louvered component 1-1 is provided at the outer cold air inlet; and a top air-out component 4 is provided at the inner hot air outlet. The top air-out component 4 includes an air-out louvered component 4-1 and a labyrinth passage 4-2 arranged inside the air-out louvered component 4-1.

The low-protection grade installation cavities of the DC cabinets on the two sides are cooled by forced air cooling. The outside cold air (with an airflow direction indicated by I) is drawn by the centrifugal fan from the air-in louvered component 1-1 into the low-protection grade installation cavity, to cool the reactor 1-2, the resistor 1-3 and the heat sink 1-5 and other devices, and is discharged outward via the top air-out component 4. The labyrinth passage 4-2 of the top air-out component 4 can play a role of protecting the inner hot air outlet, to achieve waterproofing and improve the protective effect.

Specifically, the outer cold air inlet is at a lower part of each of the cabinets on the two sides, and there are two air inlets in total, the outer cold air outlet is at the top of the cabinet, and there are six air outlets in total. As shown in FIG. 1 and FIG. 3, the airflow enters from the lower side and exit from the upper side of the cabinet, which facilitates outflow of the hot air, thus improving the heat exchange efficiency. It can be appreciated that the above outer cold air inlet and the inner hot air outlet may also be arranged at other portions, which is not limited specifically in the present application.

The above embodiments are described in a progressive manner. Each of the embodiments is mainly focused on describing its differences from other embodiments, and references may be made among these embodiments with respect to the same or similar portions among these embodiments.

Based on the above description of the disclosed embodiments, those skilled in the art is capable of carrying out or using the present application. It is obvious for those skilled in the art to make many modifications to these embodiments. The general principle defined herein may be applied to other embodiments without departing from the spirit or scope of the present application. Therefore, the present application is not limited to these embodiments illustrated herein, but should be defined by the broadest scope consistent with the principle and novel features disclosed herein.

What is claimed is:

1. An inverter power cabinet, comprising a cabinet body and power devices arranged in the cabinet body, wherein the cabinet body has a low-protection grade installation cavity and a high-protection grade installation cavity, the high-protection grade installation cavity is an airtight cavity;
   the power devices comprise high protection grade power devices arranged in the low-protection grade installation cavity and low-protection grade power devices arranged in the high-protection grade installation cavity, wherein:
   the low-protection grade installation cavity has an outer cold air inlet and an inner hot air outlet which are in communication with outside world, and a first fan is further provided in the low-protection grade installation cavity; and
   the inverter power cabinet further comprises a heat exchanger configured to dissipate heat of the high-protection grade installation cavity; and
   wherein at least one second fan is further arranged in the high-protection grade installation cavity; and
   the cabinet body comprises a DC cabinet and an AC cabinet, wherein:
   the DC cabinet has the low-protection grade installation cavity and a first high-protection grade installation cavity, and the low-protection grade installation cavity is hermetically separated from the first high-protection grade installation cavity;
   the AC cabinet has a second high-protection grade installation cavity; and
   the high-protection grade installation cavity comprises the first high-protection grade installation cavity and the second high-protection grade installation cavity.

2. The inverter power cabinet according to claim 1, wherein the first high-protection grade installation cavity and the second high-protection grade installation cavity are partitioned by a partition plate, and the partition plate is provided with an inner circulation air inlet and an inner circulation air outlet via which the first high-protection grade installation cavity is in communication with the second high-protection grade installation cavity; and
   the number of the heat exchanger is one, and the one heat exchanger is arranged on an AC cabinet door plate of the AC cabinet, and a heat dissipation passage of the heat exchanger is in communication with the second high-protection grade installation cavity.

3. The inverter power cabinet according to claim 2, wherein the first fan is a centrifugal fan; and
   the number of the at least one second fan is two, and the two second fans are respectively an inner circulation axial flow fan arranged in the first high-protection grade installation cavity and an inner circulation centrifugal fan arranged in the second high-protection grade installation cavity.

4. The inverter power cabinet according to claim 3, wherein the inner circulation centrifugal fan is arranged on the AC cabinet door plate, and the AC cabinet door plate is further provided with an inner circulation air duct via which an air outlet of the inner circulation centrifugal fan is in communication with an air inlet of the heat dissipation passage.

5. The inverter power cabinet according to claim 4, wherein the heat exchanger is an aluminum foil air-air heat exchanger; and the AC cabinet door plate is further provided with an outer circulation air duct configured to introduce cold air to fins of the aluminum foil air-air heat exchanger, and the outer circulation air duct has an outer circulation air inlet and an outer circulation air outlet which are in communication with the outside world, and an outer circulation centrifugal fan is arranged in the outer circulation air duct.

6. The inverter power cabinet according to claim 1, wherein the high-protection grade power devices comprise a reactor, a resistor, and a heat sink; and the low-protection grade power devices comprise:

an inverter module, a capacitor and a DC air switch component arranged in the first high-protection grade installation cavity, and an AC capacitor, an AC breaker and an AC contactor arranged in the second high-protection grade installation cavity.

7. The inverter power cabinet according to claim 1, wherein the number of the DC cabinet is two and the two DC cabinets are respectively located at two sides of the AC cabinet.

8. The inverter power cabinet according to claim 1, wherein the outer cold air inlet is located at a bottom of a side wall of the low-protection grade installation cavity, and the inner hot air outlet is located at a top wall of the low-protection grade installation cavity;

an air-in louvered component is provided at the outer cold air inlet; and a top air-out component is provided at the inner hot air outlet, and comprises an air-out louvered component and a labyrinthine passage arranged at an inside of the air-out louvered component.

* * * * *